United States Patent [19]
Ochiai et al.

[11] 3,949,290
[45] Apr. 6, 1976

[54] INSTRUMENT TRANSFORMER WITH CONE-SHAPED INSULATING LAYER

[75] Inventors: Tomoyoshi Ochiai; Shinichi Kuze; Ikuro Hirano, all of Tokyo, Japan

[73] Assignees: Kabushiki Kaisha Meidensha; The Tokyo Electric Power Co., Ltd., both of Tokyo, Japan

[22] Filed: Dec. 3, 1974

[21] Appl. No.: 529,131

[30] Foreign Application Priority Data

Dec. 7, 1973  Japan.............................. 48-138936
Jan. 30, 1974  Japan.............................. 49-12626
Feb. 25, 1974  Japan.............................. 49-22493

[52] U.S. Cl................. 323/44 R; 323/94 H; 324/45
[51] Int. Cl.²......................................... G05F 7/00
[58] Field of Search................ 307/278; 310/DIG. 3; 322/DIG. 5; 338/324; 329/200; 324/45, 127; 323/6, 44 R, 94 H

[56] References Cited
UNITED STATES PATENTS

| 3,187,254 | 6/1965 | Wasserman...................... 323/94 H |
| 3,564,395 | 2/1971 | Hieronymus et al............. 323/94 H |
| 3,786,272 | 1/1974 | Gamble et al. ................ 310/DIG. 3 |
| 3,851,108 | 11/1974 | Freimanis ....................... 323/94 H |

*Primary Examiner*—Gerald Goldberg
*Attorney, Agent, or Firm*—Haseltine, Lake & Waters

[57] ABSTRACT

An instrument transformer being applicable for a current transformer and/or a voltage transformer which is comprised of a coil for developing magnetic field related to a primary current, the Hall element for generating the voltage in response to the magnetic field developed by the coil, a shield pipe for supporting and enclosing the Hall element, and a cone shaped insulating layer being laid between the coil and the shield pipe, enclosing the shield pipe.

16 Claims, 19 Drawing Figures

F I G.12
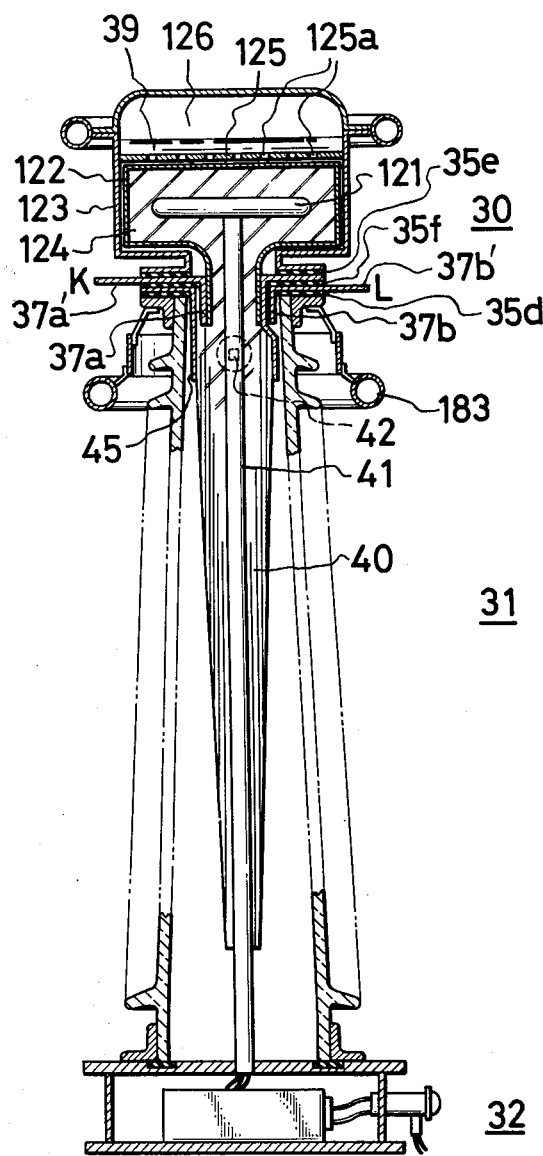

INSTRUMENT TRANSFORMER WITH CONE-SHAPED INSULATING LAYER

FIELD OF THE INVENTION

The present invention relates to devices in which the current or voltage in the primary circuit is transformed for measurement, the devices being commonly referred to as instrument transformer.

THE PRIOR ART

Known in the art is an instrument transformer of the type in which semiconductor devices acting to generate a voltage in response to the magnetic field applied, thereto such as Hall elements are provided in the gap of the iron core enclosing a primary conductor. In such type transforming a main body of the transformer including an iron core is located in an upper oil chamber mounted on an upper end of a porcelain tube. For this, the upper portion of the transformer is heavier than a lower portion thereof so that the transformer is unstable in structure. When a recent tendency of a high voltage power transmission system and the resulting large porcelain tubes are taken into consideration, such unstable transformer is problematic in the earthquake-proof thereof. Further, the transformer has additional problems in that the insulating structure thereof is complex and thus the manufacturing thereof is difficult thereby to be high in cost.

For an easy of explanation, a detailed description of the conventional transformer will be made later with reference to the accompanying drawings.

SUMMARY OF THE INVENTION

Accordingly, an object of the present invention is to provide an instrument transformer which is small in size and stable in structure.

Another object of the present invention is to provide an instrument transformer being highly stable in performance for temperature variation and external magnetic disturbance.

According to one aspect of the present invention, there is provided an instrument transformer comprising a magnetic field developing means for developing magnetic field related to a primary current, a magnetism to voltage converter means for generating voltage in response to the magnetic field developed by the magnetic field developing means, a tubular shield means for supporting and enclosing the magnetism to voltage converting means, and a cone shaped insulating layer enclosing the tubular shield means and laying between the magnetic field developing means and the tubular shield means.

Other objects and features of the present invention will be apparent from the description taken in connection with the accompanying drawings, in which:

BRIEF DESCRIPTION OF THE DRAWINGS

FIG. 12 is a longitudinal sectional view of a third embodiment of an instrument transformer according to the present invention.

DETAILED DESCRIPTION OF THE INVENTION

For a better understanding of the present invention, a conventional transformer will first be described referring to FIGS. 1 and 2.

Figure 1:
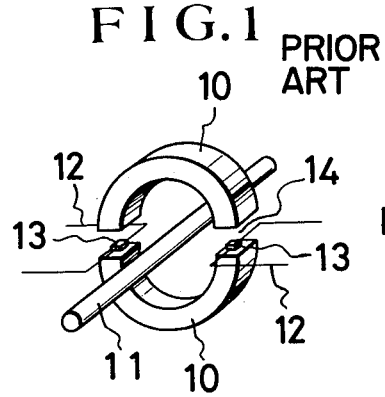
FIG. 1 shows a schematic diagram illustrating the disposition of Hall elements and iron cores in a conventional instrument transformer.
Figure 2:
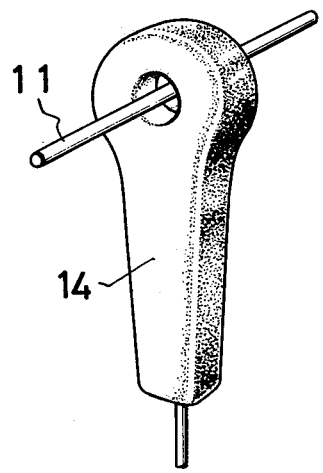
FIG. 2 shows a perspective view of a part of the conventional transformer.

Referring now to FIG. 1, there is shown a part of a conventional transformer. As shown in FIG. 1, Hall elements with lead wires 12 are disposed in the gap 14 of the iron core 10 enclosing disposed in the gap 14 of the iron core 10 enclosing a primary conductor 11. A structure for insulation of the conventional transformer necessarily takes a form of an eye bolt like appearance, as shown in FIG. 2. The main body including iron core 10 is disposed in the upper oil chamber which is placed on the top of the porcelain tube, with the result that the weight in the upper portion of the porcelain tube is heavier than that in the lower portion thereof. For this, the conventional transformer is unstable instructure. A recent tendency of high voltage in the lower transmission system requires a severe contamination-proof of the porcelain tube. This also results in an elongation of the porcelain tube so that the bending moment imparted on the porcelain tube becomes large and thus its earthquake-proof is poor. This is a fatal disadvantage for an instrument transformer handling a high tension or heavy current. This type of transformer also has an additional problem in the insulating structure of the iron core 10. Hall elements 13, and lead wires 12 to the primary lead wire 11. More precisely, a complex structure is necessary to ensure the insulation of Y-shaped portion at the joint between the ring portion of the inversed eye bolt like transformer and the straightened leg portion thereof. Particularly, when insulation is made by using a thick insulating structure, the manufacturing thereof becomes difficult, thereby resulting in an increase of cost.

Figure 3:
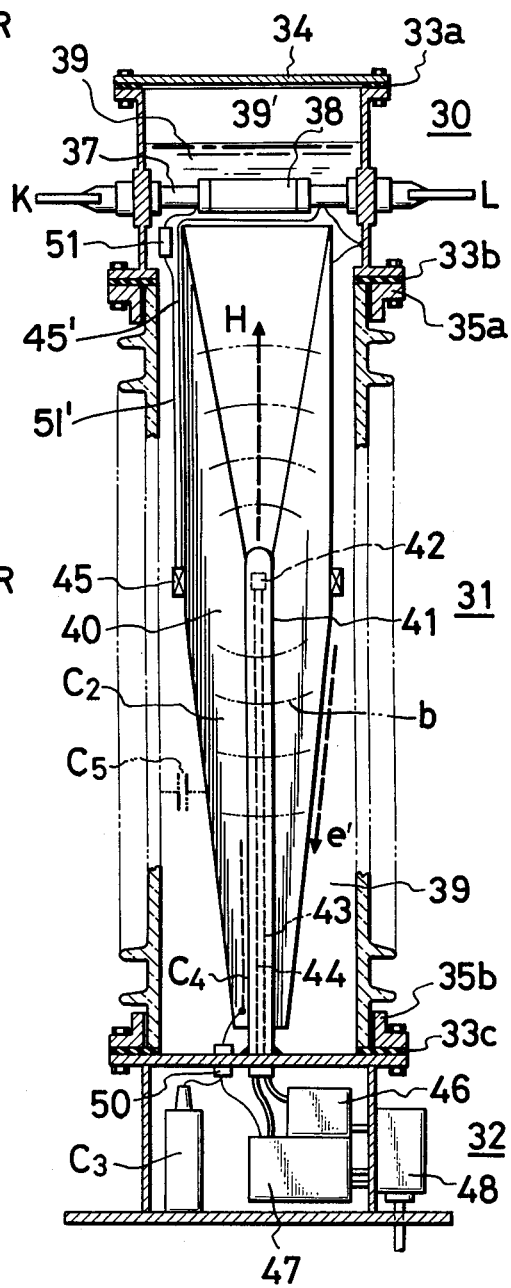
FIG. 3 shows a longitudinally sectional view of an embodiment of a transformer according to the present invention.

With these difficulties in mind, the present invention will be described in detail with reference to the accompanying drawings. Referring now to FIG. 3, there is shown one form of instrument transformers according to the present invention. This transformer generally consists of three sections, an upper oil case 30, a procelain tube 31, and a lower case 32. The upper oil case 30 with tubular cross section is tubular is mounted on the top of the porcelain tube 31 with packing 33b therebetween. More precisely, the flange of the circular ring 35a rigidly fixed around the upper end of the porcelain tube 31 is fixed to the bottom flange of the upper oil case 30 by means of suitable fixing means such as bolts. A cover plate 34 is fixed to the flange of the top end of the upper oil case 30 with packing means 33a therebetween by means of suitable fixing means. The porcelain tube 31 also is mounted on the lower case 32 with packing means 33c therebetween. That is, the flange of the circular ring 35b which is rigidly fitted around the lower end of the porcelain tube 31, is fixed onto the lower case 32 by means of suitable fixing means.

The upper case 30 communicates with the porcelain tube 31 in the inner space which is filled with oil 39 but has a sufficient air space 39' above the oil level. A primary conductor 37 with a resistor 38 connected in series therewith passes across the upper case 30. The primary conductor 37 provided with an input terminal K and an output terminal L is fitted to the respective side walls of the upper case 30 so as to prevent the oil leakage, by suitable means.

A shield pipe 41 is planted in the top plate of the lower case 32 with a tight connection therebetween by using wax or adhesives so as to prevent the oil leakage. A voltage detecting means 42 such as a Hall element, a search coil, etc. is disposed in the shield pipe 41. In this example, a Hall element is employed as the voltage and thus will be referred by the numeral cone shaped insulating layer 40 is formed around the shield pipe 41 and also is supported by the same. A magnetic field developing winding 45 is fitted around the cone shaped insulating layer 40 so as to surround the voltage detecting means as indicated by 42. A shunt resistor 51 is connected at one end to the input terminal K side of the primary conductor 37 while at the other end to one end of the magnetic field developing coil 45. The other end of the magnetic field developing coil 45 is connected to the output terminal L side of the primary conductor 37. The cone shaped insulating layer 40 is connected at the outermost to the L terminal side of the primary conductor 37 while at the innermost thereof through a terminal 50 to a capacitor $C_3$ and a voltage divider housed in a voltage divider box 47 of the lower case 32. The Hall element 42 is connected to a DC power source 46 and another voltage divider housed in the voltage divider box 47, both of which are accomodated in the lower case 32.

The shield pipe 41 may be made of a non-magnetic insulating pipe coated thereover with carbon or made of a stainless pipe. The cone shaped insulating layer 40 serves to secure the insulation between the magnetic field developing coil 45 and the shield pipe 41, and also to form a coupling capacitor $C_2$ which will subsequently be described. The cone shaped insulating layer 40 consists of concentric cylinders of an oil filled kraft paper or press board, and a layer of metal foil therebetween. The cone shaped insulating layer 40 tapers gradually from the place where the magnetic field developing coil is disposed, toward the lower of the shield pipe in order that the electric field e' along the creepage distance of the lower side is uniformly distributed as shown by equipotential lines 6. The outermost layer of metal foil of the cone shaped insulating layer 40 is at a high potential, while the shield pipe as well as the lower case 32 are grounded. In this constructing, the coupling capacitor $C_2$ is formed by the cone shaped insulating layer 40, as previously stated, while another capacitor is formed between the innermost metal foil of the cone shaped insulating layer and the shield pipe 41. The later capacitor is used as a voltage dividing capacitor $C_4$ for a voltage transformer, as will subsequently be described.

Figure 4:
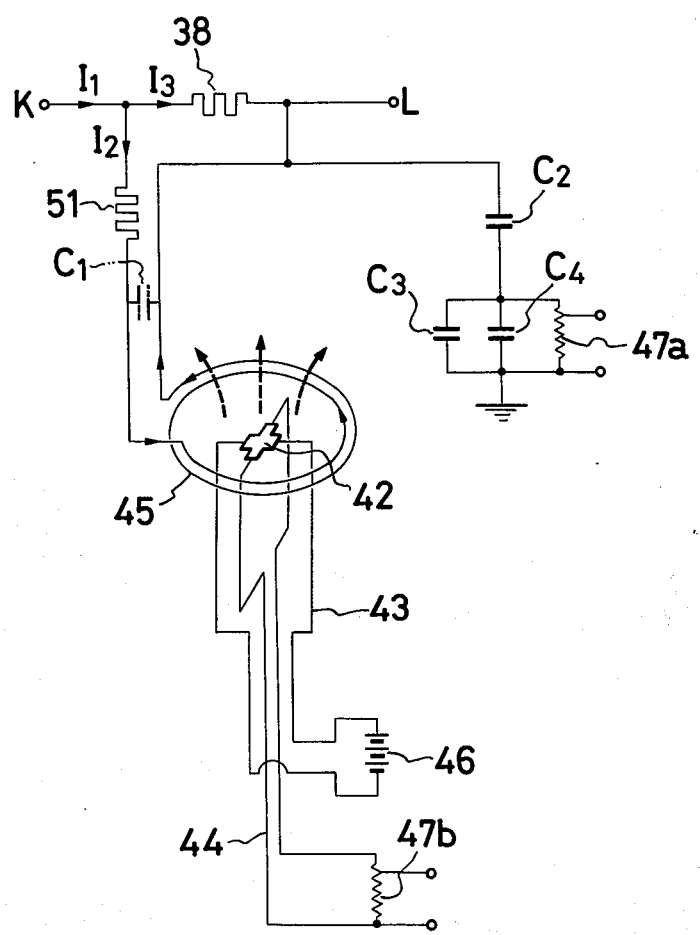
FIG. 4 is a circuit diagram of the transformer in FIG. 3.

Reference now is made to FIG. 4 illustrating an electrical circuit of the transformer heretofore described in connection with FIG. 3. In FIG. 4, like reference numerals refer to like components in FIG. 3. In the figure, the input terminal K is connected to one end of the resistor 38 and to one end of the resistor 51. These resistors 38 and 51 are both shunt resistors and particularly the resistor 51 serves to adjust the current flowing through the magnetic field developing coil 45. That is, in this embodiment, the resistor 51 is used for adjusting the shunt current. The other end of the resistor 38 is connected to the terminal L through a line 451, one end of the magnetic field developing coil 45 and one end of the coupling capacitor, $C_2$. The other end of the resistor 51 is connected through a line 51' to the other end of the magnetic field developing coil 45. That is, the series connected circuit consisting of the resistor 51 and the coil 45, is connected across the resistor 38. For this, the primary current $I_1$ is branched into the currents $I_2$ and $I_3$, as shown in FIG. 4. The ratio of the currents $I_2$ and $I_3$ is controlled by adjusting resistor 51.

The other end of the coupling capacitor $C_2$ is connected to one end of the parallel connected circuit consisting of the capacitor $C_3$, the capacitor $C_4$ and the voltage divider 47a. The parallel connected circuit is grounded at the other end. As previously stated, the capacitor $C_4$ is formed between the innermost metal foil of the cone shaped insulating layer and the shield pipe, and is used for dividing the voltage. The capacitor $C_3$ and the resistor 47a are housed in the lower case 32. The parallel circuit forms a voltage transformer, together with the coupling capacitor $C_2$. The voltage proportional to the primary voltage appears across the voltage divider resistor 47a. The Hall element 42 is disposed at the center of a coil 45 to develope the voltage in response to the magnetic field developed by the coil 45. The DC power source 46 supplies a bias voltage to the Hall element through the lead wire 43. The output voltage generated by the Hall element 42 is applied to the voltage divider 47b through the lead wire 44. The coil 45, the Hall element 42 and the voltage divider 47b constitute a current transformer. That is, the voltage proportional to the primary current $I_1$ appears across the voltage divider 47b. The use of the resistors 38 and 51 enables the current flowing through the coil 45 to be reduced, so that the lead wire with small cross section may be used, even if the primary current is heavy.

When dealing with small primary current, the primary current $I_1$ may be directly fed to the coil 45 without the shunt resistors 38 and 51.

Figure 5:
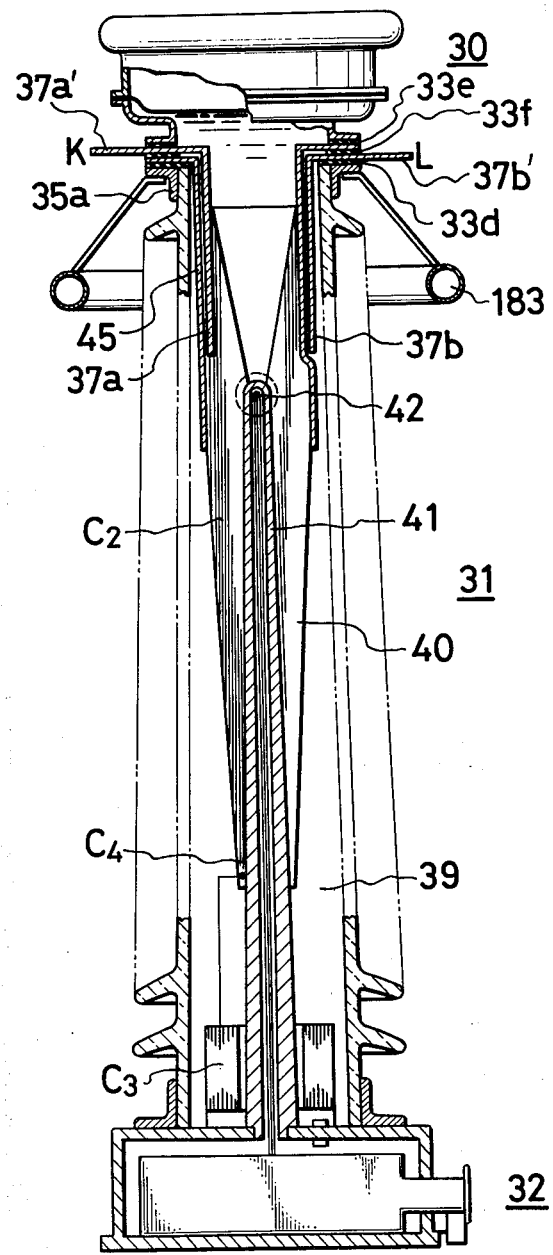
FIG. 5 is a longitudinally sectional view of second embodiment an instrument a transformer according to the present invention.

Referring now to FIG. 5, there is shown a second embodiment of the transformer according to the present invention. In the figure, like numerals are used to designate like or equivalent parts or components in FIG. 3.

A feature of this embodiment is found in the structure of the magnetic field developing coil 45. As shown in FIG. 5, the magnetic field developing coil as generally indicated by 45 is a combination of an inner tube 37a and an outer tube 37b. These tubes are made of metal plate or casting with good conductivity such as copper or aluminum.

This tubular coil 45 will be described in detail with reference to FIGS. 6 to 11.

Figure 6:
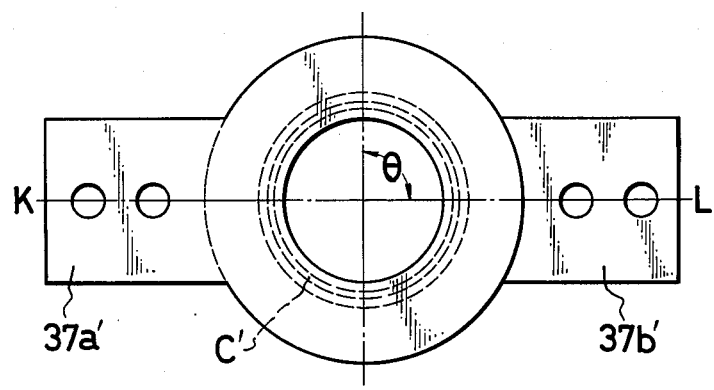
FIG. 6 is a plan view of a magnetic field developing coil used in the transformer in FIG. 5.
Figure 8:
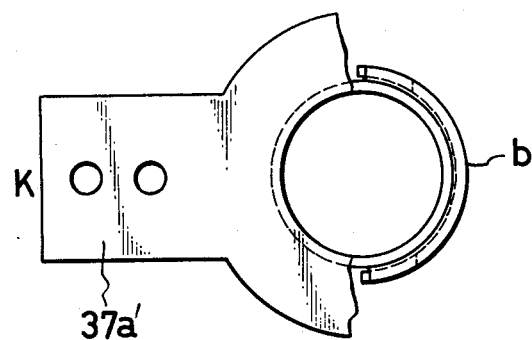
FIG. 8 is a plan view broken in part of the inner tube constituting the magnetic field developing coil in FIG. 6.
Figure 9:
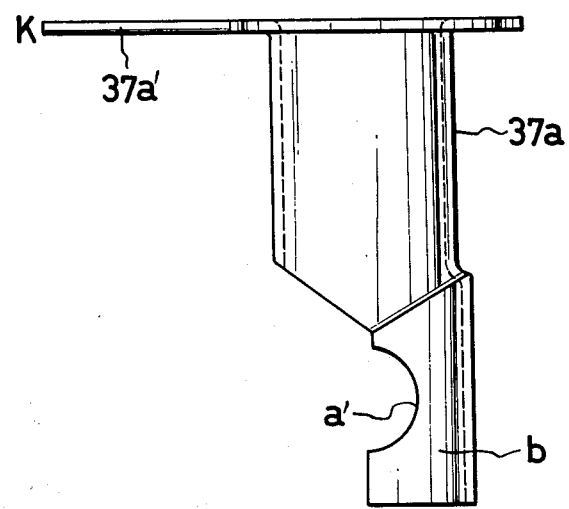
FIG. 9 is a front view of the inner tube in FIG. 8.
Figure 10:
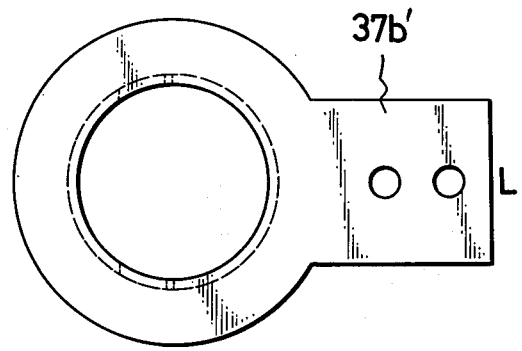
FIG. 10 is a plan view of the outer tube constituting the magnetic field developing coil in FIG. 6.
Figure 11:
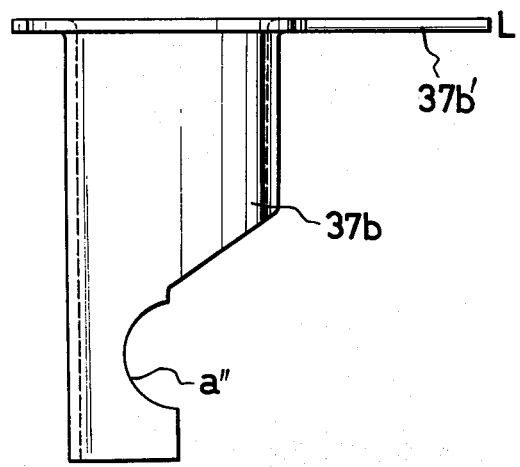
FIG. 11 is a front view of the outer tube in FIG. 10.

The inner tube 37a is integrally provided on the top with a flange 37a' whose rectangular portion is used for the input terminal K of the primary conductor, while the outer tube 37b also is integrally provided on the top with the flange 37b', whose rectangular portion is used for the output terminal L (FIGS. 6, 8 and 10). As shown in FIG. 9, the lower half portion of the inner tube is cut away slanting downwardly to the center of the inner tube, along the axis of the inner tube for a short distance, forming half circle a' and finally again along the axis of the inner tube. The radius of the lower portion of the inner tube 37a not cut away is the same as that of the outer tube 37b, i.e. larger than that of the upper of the inner tube 37a. This is shown in the portion indicated by the reference character b in FIG. 9.

On the other hand, the lower half portion of the outer tube 37b is cut away slanting downwardly to the center of the outer tube, along the axis thereof for a short distance, forming a half circle a'', and finally again along the axis thereof.

Figure 7A:
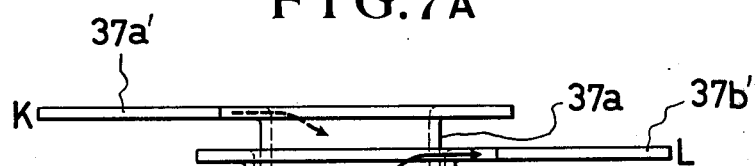
FIG. 7A is a front view of the same coil in FIG. 6.
Figure 7B:
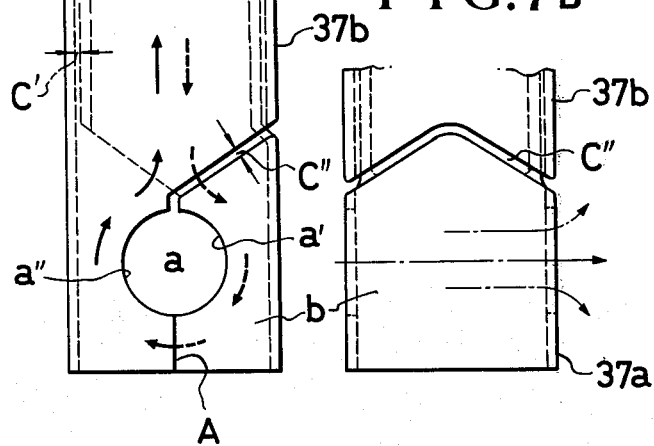
FIG. 7B is a side view of the same coil in FIG. 6.

FIG. 7A illustrates the tubular coil formed when thus shaped inner and outer tubes 37a and 37b are combined. As shown in FIG. 7A, the two half circles a' and a'' form a circle a, and these two tubes contact with each other as indicated by A at the lower thereof, while at the upper portions thereof, these tubes 37a and 37b are separated each other with the gaps c' and c''. FIG. 7B illustrates the two slanting cut away portions of the tubes, when these inner and outer tubes are combined.

With such construction of the tubular coil, the primary current $I_1$ from the input terminal K flows through the inner tube 37a, the contact portion A of the inner tube and the outer tube, and the outer tube 37b to the output terminal L, as shown by arrows (FIG. 7A). That is, the tubular coil is an one-turn coil around the circle a. Thus, the magnetic field H developed by this coil is directed normal to that of the coil in embodiment in FIG. 3 as shown in FIG. 7b. Therefrom, the respective electrodes of the cone shaped insulating layer does not interlace with the developed magnetic field.

Returning to FIG. 5, the tubular coil 45 is inserted in the porcelain tube 31 and supported by the flanges 37a' and 37b' held by the flange of the circular ring 35a and the bottom flange of the upper oil case 30. Packing 33d is placed between the flange 37b' and the flange of the circular ring 35a. Packing 33e is put between the flange 37a' and the bottom flange of the upper oil case 30. Insulating packing 33f is placed between the flanges 37a' and 37b'. The upper oil case 30 is kept high potential, while the lower case 32 is at low potential as in the previous case.

As apparent from the foregoing description, the transformer of the present invention employs a magnetic field developing coil which is of coaxially combined double tubular coil and in which the primary conductor including the input and output terminals and the lead wire connecting the primary conductor and the magnetic field developing coils per se are both integral parts of the magnetic field developing coil. Accordingly, the transformer of this embodiment is applicable for a heavy current rated transformer because the cross section of the lead wire is sufficiently large. A uniform current distribution is enabled. In the case of treating heavy current, it requires no shunt resistors and no the associated lead wires. For this, an effective utilization of the space in the porcelain tube is possible and therefore the transformer may be made small in size.

A third embodiment of the transformer according to the present invention will now be described.

Reference will be made to FIG. 12, there is shown the transformer of the third embodiment. In the figure, like numerals refere to like or equivalent parts or components in FIG. 3. This embodiment is characterized by an additional capacitor forming electrode structure. As shown in FIG. 12, the shield pipe 41 extends to the upper oil case 30. A capacitance forming electrode 121 is mounted on the top of the shield pipe 41. An insulating layer 124 encloses the capacitor forming electrode 121 and the shield pipe 41. The insulating layer 124 is continuous to the cone shaped insulating layer 40 previously mentioned and this is made of the same material as that of the latter. A conductive layer 122 extends to come into contact with the inner surface of the inner tube 37a of the tubular coil 45 and also encloses the insulating layer 124. The conductive layer 122 is at high potential. The capacitance between the conductive layer 122 and the capacitor forming electrode 124 is used as a coupling capacitor, as will be described later.

Figure 13:
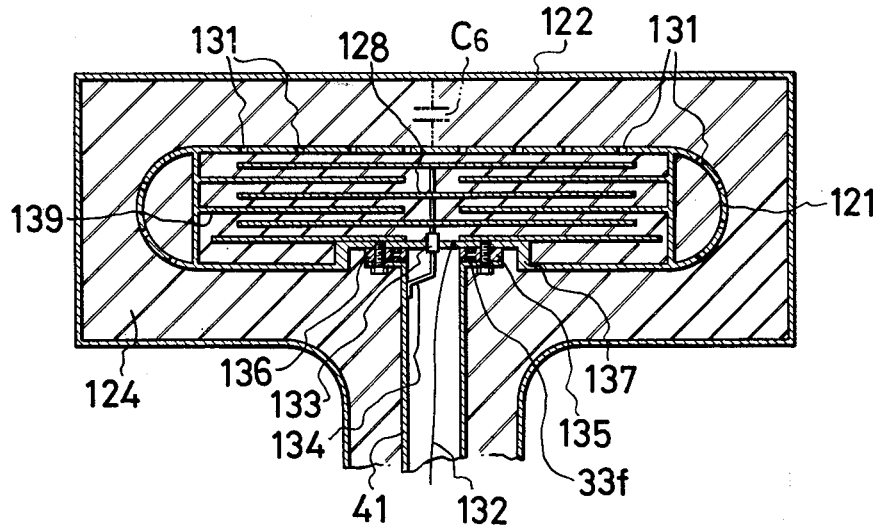
FIG. 13 is a longitudinally sectional view of a capacitor forming electrode used in the instrument transformer of FIG. 12.

Referring to FIG. 13, there is shown a detailed diagrammatic illustration of the capacitor forming electrode 121. The capacitor forming electrode 121 is made of conductive material such as aluminum and is perforated. The capacitor forming electrode 121 has a recess to which the top of the shield pipe 41 is fixed by means of screws through the insulating washer 135 a packing 35f to ensure the prevention of the oil leakage.

As above mentioned, the insulating layer 124 encloses the capacitor forming electrode 121, while it is surrounded by the conductive layer 122 connected to the inner tube 37a of the magnetic field developing coil 45. By such construction, the coupling capacitor $C_6$ formed between the conductive layer 122 and the capacitor forming electrode 121, is isolated from the porcelain tube 34 by means of the conductive layer 122, so that the coupling capacitor is not affected by the contamination of the porcelain tube.

In previous cases, the contamination of the porcelain tube forms another capacitor $C_5$ between the porcelain tube and the outermost layer of the corn shaped insulating layer 40 (FIG. 3). This capacitor $C_5$ adversely affects the coupling capacitor $C_2$ thereby to produce an error in the transformer performance. Such defect is overcome by this construction of the capacitor forming electrode 121.

The capacitor forming electrode 121 accommodates therein a plurality of electrodes extending in parallel each other which are integral parts of the capacitor forming electrode 121 and of the same potential, and another plurality of electrodes extending in parallel each other which are interlaid with the former electrodes of high potential with oil-filled insulating material thereamong such as kraft paper or press board thereamong.

The latter electrodes are all connected to the shield pipe 41 of ground potential through a lead wire 134 passing through an oil-sealed terminal 133. These interlaid electrodes with oil-filled insulating material forms a voltage dividing capacitor $C_7$.

The above mentioned coupling capacitor $C_6$ and the voltage dividing capacitor $C_7$ are placed in the same oil. That is, many holes 131 bored to the capacitor forming electrode 121 permits the oil to pass therethrough.

Figure 14:
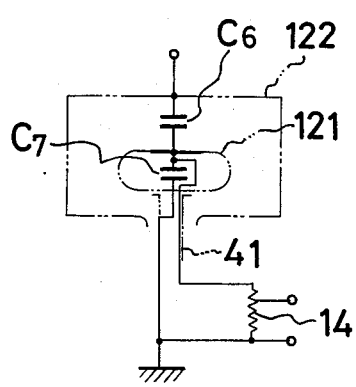
FIG. 14 is a circuit diagram of a voltage transformer section of the third embodiment of the transformer of the present invention.

FIG. 14 is an electrical illustration of the just described construction. The capacitors $C_6$ and $C_7$ are connected in series and a resistor 141 for voltage divide is connected through a lead wire 132 across the capacitor $C_7$ so as to detect the voltage drops thereacross. Thus, these components constitute a voltage transformer. As previously stated, the capacitor $C_5$ is isolated from the porcelain tube 31, so that the capacitor $C_5$ is not affected by the contamination of the porcelain tube. Further, these capacitors $C_6$ and $C_7$ are placed in the same oil, so that the error in the capacitance of these capacitors due to temperature variation may be eliminated.

Figure 15:
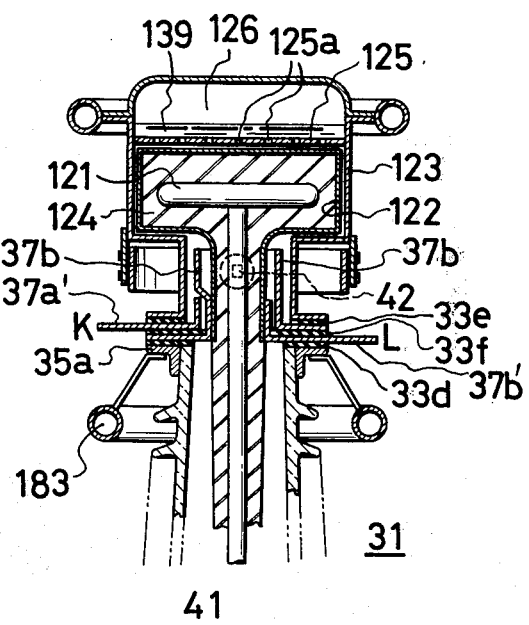
FIG. 15 is a longitudinal sectional view of a modified transformer of the one in FIG. 13.

This third embodiment of the present invention may be used with an inversed arrangement of the tubular coil 38, as shown in FIG. 15.

Figure 16:
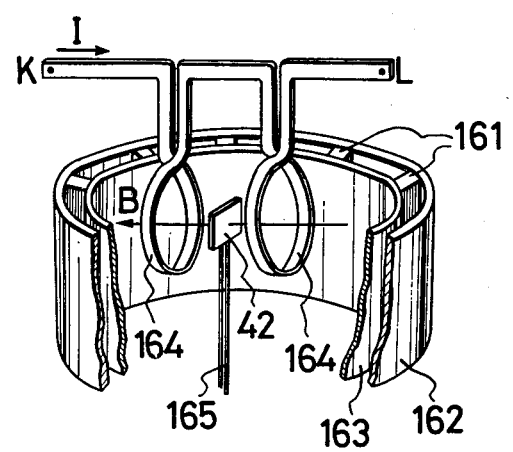
FIG. 16 illustrates in a diagramatic form a construction of magnetic shielding means which constituting a fourth embodiment of an instrument transformer according to the present invention.

A fourth embodiment of the present invention will be given below. This embodiment is featured in that means for eliminating the magnetic disturbance to the magnetic field developed by the coil, or the magnetic field to be transformed, is employed FIG. 16 is a schematic diagram of such means, in which coaxially arranged double cylinders 162 and 163 are separated by means of a plurality of spacers 161 arranged at a constant interval along the gap between these cylinders 162 and 163. The magnetic field coils 164 and the Hall element 42 are located in a known fashion in the double cylinders.

When the primary current flows from the input terminal K through the coils 164 to the output terminal L, a flux B interlacing with the coils as shown by arrow and being proportional to the primary current is developed. As well known, the Hall element 142 placed in this magnetic field produces the voltage proportional to the magnetic field.

Figure 17:
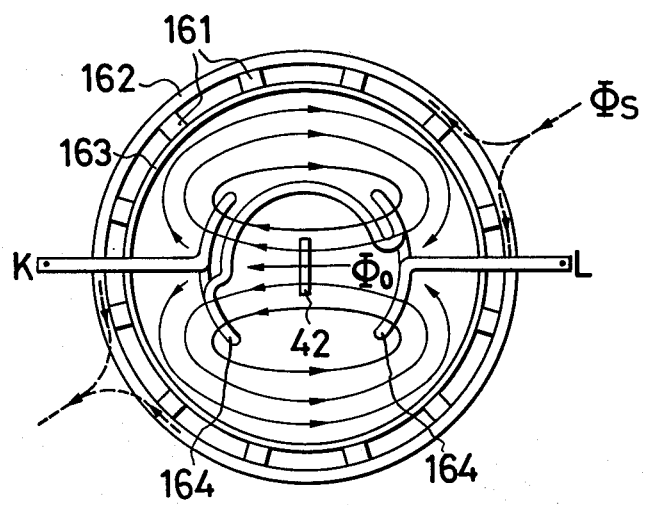
FIG. 17 is a plan view of the magnetic shielding means in FIG. 16.

In FIG. 17, the flux $\Phi_o$ developed by the coils 164 is as shown by the solid lines with arrows. Since the inner sylinder 163 is made of the metallic material of a high conductivity such as aluminum or copper, the alternating flux $\Phi_o$ induces a large amount of eddy current on the inner cylinder 163. The eddy current induced, however, counteracts against the flux $\Phi_o$ to cancel it, so that the flux $\Phi_o$ is apparently confined in the inner cylinder 163, as shown in the figure.

The outer cylinder 162 acts to prevent leakage of the flux to be transformed and shut out the flux $\Phi_o$ from the outside, for example, the flux developed by the currents of other phase lines. The outer cylinder 162 is made of electric sheet and its magnetic permiability is much higher than that of air, i.e. its reluctance is considerably low. For this, the outside flux $\Phi_a$ passes along the outer cylinder 162 as shown by the dotted lines, so that little outside flux $\Phi_s$ leaks to the inner side of the outer cylinder 162. Even if a small amount of outside flux leaks to the inner side thereof, the inner cylinder 163 shuts out the leakage of the outside flux by the same operation mentioned above. Thus, these double cylinders effectively eliminates the effects of the outside flux on the flux to be transformed.

It is to be noted that the use of the outer cylinder 162 of a high permiability, instead of these two cylinders 162 and 163, may be permitted. In this case, it is desirable, to obtain good linearity of the transformer output, that is the inside diameter of the cylinder 162 is as large as possible to secure possible large distance from the coils 164.

Figure 18:
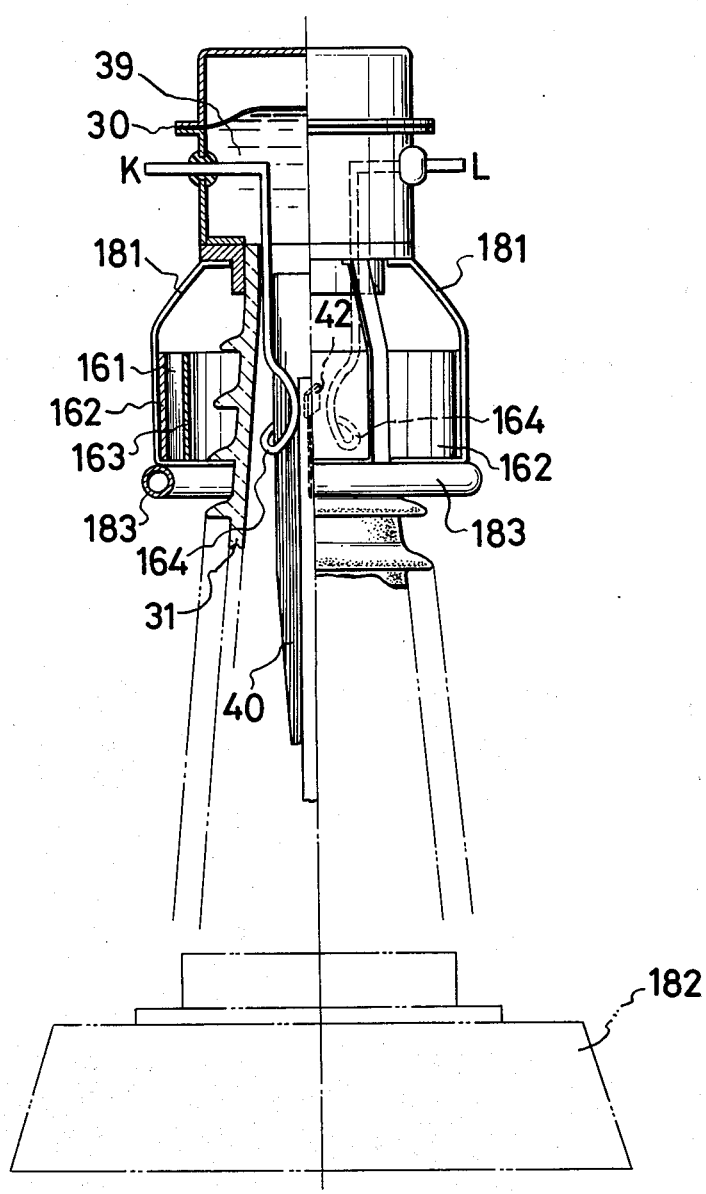
FIG. 18 is a longitudinally sectional view of the fourth embodiment of the transformer according to the present invention.

Referring now to FIG. 18, there is shown the fourth embodiment of the transformer according to the present invention, where the above-described double cylinders are incorporated into the transformer of the present invention. In the figure, a corona preventive shield ring 183 disposed around the porcelain tube 31 is supported by supporting arms 181 which are mounted at the upper ends to the upper oil case 30 while fixed at the lower ends by welding, etc. The coaxially arranged double cylinders 162 and 163 are put on the corona preventive shield ring 183 while surrounded by the supporting arms 181 and fixedly held by the supporting arms. The outer cylinder 162 is made of multilayers of iron sheets of high permiability such as silicon steel plate, permalloy, or the like, i.e. so called electric sheets. The inner cylinder 163 is made of metallic material with a relatively high conductivity such as aluminum or copper.

In assembly work, the electric sheet is turned predetermined times around the inner cylinder, on the outer surface of which spacers are mounted at a constant interval, and then the supporting members 181 are fixed on the outer surface of the electric sheet multilayers, or the outer cylinder 162. When mounting the double cylinders to the main body of the transformer, the center of the double cylinders in height must level with the position of the Hall element 42. Thus, the double cylinders may be easily mounted to the supporting arms for the corona preventive shield ring.

What is claimed is:

1. A current transformer with primary circuit in which current in the primary circuit is transformed for measurement, comprising:
    magnetic field developing means for developing a magnetic field dependent on the primary current;
    a magnetism to voltage converter for generating a voltage in response to the magnetic field developed by said magnetic field developing means;
    tubular shield means for supporting and enclosing said converter; and
    a cone-shaped insulating layer enclosing said tubular shield means and laid between said magnetic field developing means and said tubular shield means.

2. A current transformer according to claim 1 wherein said magnetic field developing means comprises coaxially arranged tubes with an inner tube and an outer tube, said inner tube having at the lower end thereof a cut-away portion including a half circle, said outer tube having a cut-away portion including a half circle, when combining said inner and outer tubes said cut-away portions forming a tubular section at the lower end of said inner and outer tubes, both said half circles forming a hole passing across said tubular section while the cut-away portions below said half circles are in contact with each other, whereby a one-turn coil is formed around said hole.

3. A current transformer according to claim 1, and further comprising cylindrical means of high permeability and arranged so as to surround said converting means and said magnetic field developing means.

4. A current transformer according to claim 3, and further comprising second cylindrical means of high conductive material coaxially disposed in said first-mentioned cylindrical means.

5. A current transformer according to claim 4 wherein said coaxially arranged cylindrical means are mounted to a corona preventive shielding ring fixed around a porcelain tube.

6. A current transformer according to claim 3 wherein said cylindrical means is mounted to a corona preventive shielding ring fixed around a porcelain tube.

7. A current transformer according to claim 1, wherein said magnetism to voltage converter comprises a Hall element.

8. A current transformer according to claim 1, wherein said magnetism to voltage converter comprises a search coil.

9. A current transformer according to claim 1, wherein said magnetic field developing means comprises a coil.

10. A device for transforming voltage and current for measurement comprising:
   a primary circuit;
   coaxially arranged tubes with an inner tube and an outer tube, said inner tube having at the lower end thereof a cut-away portion including a half circle, said outer tube having a cut-away portion including a half circle, when combining said inner and outer tubes said cut away portion forming a tubular section at the lower end of said inner and outer tubes, both said half circles forming a hole passing across said tubular section while the cut-away portions below said half circles are in contact with each other, whereby a one-turn coil is formed around said hole;
   magnetic field developing means for developing a magnetic field dependent on the current in said primary circuit;
   a magnetism to voltage converter for generating a voltage in response to the magnetic field developed by said magnetic field developing means;
   tubular shield means for supporting and enclosing said converter;
   a cone-shaped insulating layer enclosing said tubular shield means and laid between said magnetic field developing means and said tubular shield means;
   first conductive means having a number of perforations and mounted on the top of said tubular shield means;
   an insulating layer continuous with said cone-shaped insulating layer for converting said first conductive means; and
   second conductive means connected to said inner tube and enclosing said insulating layer.

11. A device according to claim 10, wherein said first conductive means includes a first group of conductive means and a second group conductive means, both said groups of conductive means being alternately layered with insulating material thereamong, respectively, said first group of conductive means being connected to said first conductive means, said second group of conductive means being connected to said tubular shield means.

12. A device according to claim 10, wherein said magnetism to voltage converter comprises a Hall element.

13. A device according to claim 10, wherein said magnetism to voltage converter comprises a search coil.

14. A device according to claim 11 wherein said first conductive means is connected to one end of a resistor having the other end grounded, the outermost layer of said cone-shaped insulating layer being at a high potential, said tubular shield means being at ground potential.

15. A device for transforming voltage and current in for measurement, comprising:
   a primary circuit;
   magnetic field developing means for developing a magnetic field related to current in said primary circuit;
   a magnetism to voltage converter for generating a voltage in response to said magnetic field developing means;
   tubular shield means for supporting and enclosing said converter; and
   a cone-shaped insulating layer comprising multilayers of conductive sheets with insulating material filled thereamong enclosing said tubular shield means and laid between magnetic field developing means and said tubular shield means; said magnetic field developing means being connected at one end to an input primary conductor, the other end of said field developing means being connected to an output primary conductor, said cone-shaped insulating layer being connected at the outermost conductive sheet to said other end of said magnetic field developing means, the innermost conductive sheet being connected to one end of a parallel circuit comprising a capacitor and a voltage divider with one terminal at ground potential, the outermost layer of said cone-shaped insulating layer being at a high potential, said tubular shield means being at ground potential.

16. A device according to claim 15 wherein said magnetism-to-voltage converter is connected across a resistor and to a DC power source.

* * * * *